United States Patent
Kim

(10) Patent No.: US 9,306,180 B2
(45) Date of Patent: Apr. 5, 2016

(54) STRETCHABLE SUBSTRATE AND ORGANIC LIGHT EMITTING DISPLAY APPARATUS COMPRISING THE SAME

(71) Applicant: Samsung Display Co., Ltd., Yongin (KR)

(72) Inventor: Youngchan Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/609,197

(22) Filed: Jan. 29, 2015

(65) Prior Publication Data

US 2016/0049602 A1 Feb. 18, 2016

(30) Foreign Application Priority Data

Aug. 12, 2014 (KR) .................. 10-2014-0104528

(51) Int. Cl.
| | | |
|---|---|---|
| H01L 51/00 | (2006.01) | |
| H01L 27/00 | (2006.01) | |
| H01L 51/52 | (2006.01) | |
| H01L 27/32 | (2006.01) | |

(52) U.S. Cl.
CPC ........ *H01L 51/0097* (2013.01); *H01L 27/3244* (2013.01); *H01L 51/5206* (2013.01); *H01L 51/5221* (2013.01); *H01L 2251/5338* (2013.01)

(58) Field of Classification Search
CPC ............ H01L 51/0097; H01L 51/5206; H01L 51/5221; H01L 24/01; H01L 25/0655; H01L 23/5387; B25J 13/084; G01L 1/205; H05K 3/4092
See application file for complete search history.

(56) References Cited

U.S. PATENT DOCUMENTS

| | | | |
|---|---|---|---|
| 6,743,982 B2 * | 6/2004 | Biegelsen | B25J 13/084 174/69 |
| 2002/0094701 A1 | 7/2002 | Biegelsen et al. | |
| 2004/0087066 A1 * | 5/2004 | Voutsas | G11C 13/0007 438/147 |
| 2004/0192082 A1 | 9/2004 | Wagner et al. | |
| 2010/0116526 A1 | 5/2010 | Arora et al. | |

* cited by examiner

*Primary Examiner* — Victor A Mandala
*Assistant Examiner* — Quovaunda V Jefferson
(74) *Attorney, Agent, or Firm* — H.C. Park & Associates, PLC

(57) ABSTRACT

A stretchable substrate including a plurality of islands that are disposed in a planar lattice pattern and spaced apart from each other, and a plurality of bridges that connect two adjacent islands. An aperture is formed between a pair of bridges, which are adjacent and parallel to each other, and the plurality of bridges are capable of stretching and contraction, and the shapes of the islands remain unchanged during the stretching and contraction of the bridges.

15 Claims, 7 Drawing Sheets

STRETCHABLE SUBSTRATE AND ORGANIC LIGHT EMITTING DISPLAY APPARATUS COMPRISING THE SAME

CROSS-REFERENCE TO RELATED APPLICATION

This application claims priority from and the benefit of Korean Patent Application No. 10-2014-0104528, filed on Aug. 12, 2014, which is hereby incorporated by reference for all purposes as if fully set forth herein.

BACKGROUND

1. Field

Exemplary embodiments relate to a stretchable substrate and an organic light emitting display apparatus including the same.

2. Discussion of the Background

An organic light-emitting display apparatus has been widely used in many applications, ranging from a personal portable apparatus, such as an MP3 player and a cell phone to a television due to its excellent properties, such as a wide viewing angle, high contrast, a quick response rate, lower power consumption, etc. Also, the thickness and weight of the organic light-emitting display apparatus may be reduced as compared to other display apparatuses in use, since the organic light-emitting display apparatus is self-emissive and thus, there is no need for extra light source.

With the recent technological development in display apparatuses, research and development regarding a flexible display apparatus that is bendable or may be wound in a roll shape has been conducted. Furthermore, research regarding a stretchable display apparatus that changes shape in various ways has also been actively carried out. The stretchable display apparatus may include a display device using an extendable substrate. However, the range of materials available to form the extendable substrate is limited, and extension of the substrate depends only on the material characteristics, and not on the construction characteristics of the substrate itself.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a stretchable substrate, and an organic light emitting display apparatus including the same.

Additional aspects will be set forth in the detailed description which follows, and, in part, will be apparent from the disclosure, or may be learned by practice of the inventive concept.

An exemplary embodiment discloses a stretchable substrate including a plurality of islands disposed in a planar lattice pattern and spaced apart from each other; and a plurality of bridges connecting two adjacent islands among the islands. An aperture is formed between a pair of bridges, which are adjacent and parallel to each other among the bridges. The bridges are configured to stretch and contract, and the shapes of the islands remain unchanged during the stretching and contraction of the bridges.

An exemplary embodiment also discloses an organic light-emitting display apparatus including a stretchable substrate including a plurality of islands disposed in a planar lattice pattern, and a plurality of bridges that connect two adjacent islands among the islands; and a plurality of pixel areas formed on the stretchable substrate. The pixel areas are formed on the islands, and the bridges are configured to stretch and contract such that the distance between pixel areas is changed during the stretching and contraction of the bridges.

The foregoing general description and the following detailed description are exemplary and explanatory, and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1A:
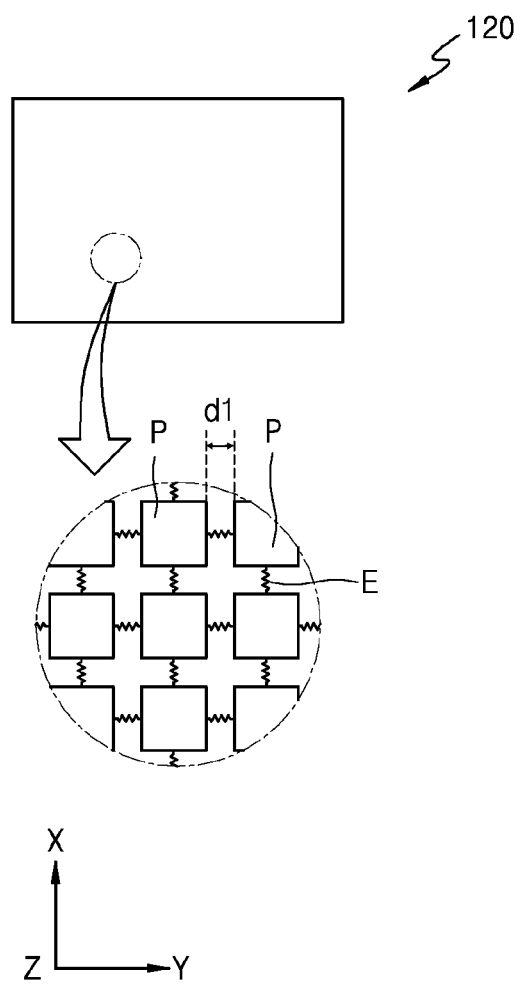
FIG. 1(A) and FIG. 1(B) are schematic plan views of an organic light emitting display apparatus according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Referring to FIGS. 1 to 4, an organic light-emitting display apparatus 100 may be stretched in a first direction (X), in a second direction (Y), or in both the first direction (X) and the second direction (Y). A planar surface of the organic light-emitting display apparatus 100 may be defined by the first direction (X) and the second direction (Y), whereas a thickness of the organic light-emitting display apparatus 100 may be defined by a third direction (Z), which is perpendicular to the first direction (X) and the second direction (Y).

Figure 1B:
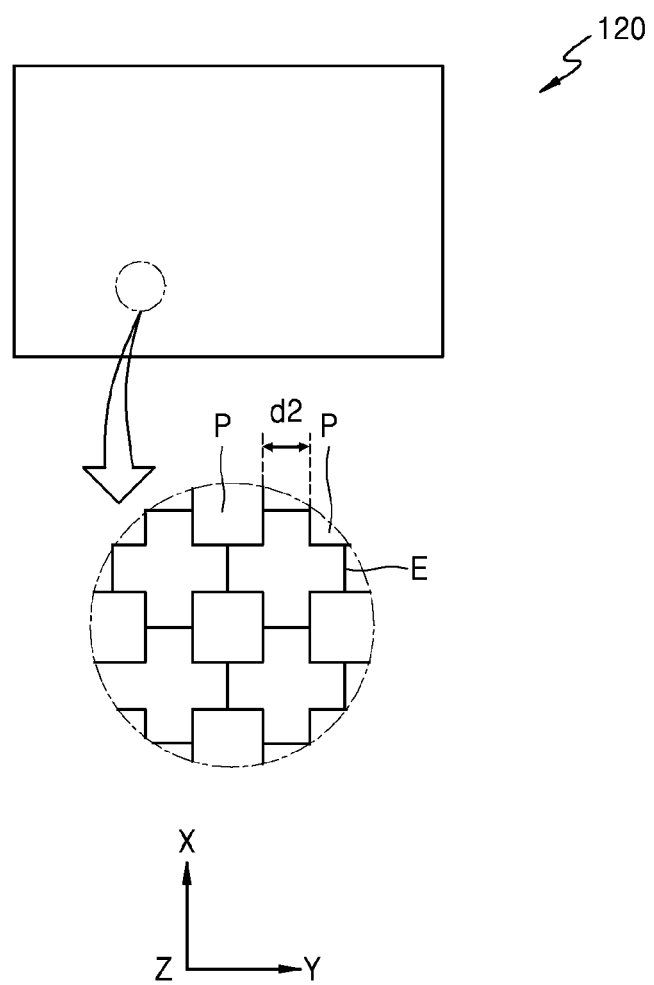

FIG. 1(A) shows the organic light-emitting display apparatus 100 prior to stretching, and FIG. 1(B) shows the organic light-emitting display apparatus 100 after stretching. By stretching the organic light-emitting display apparatus 100, a distance between the pixel units P in the organic light-emitting display apparatus 100 may be increased from a first distance d1 to a second distance d2 while keeping the thickness of the organic light-emitting display apparatus 100 constant along the third direction (Z).

The organic light-emitting display apparatus 100 may include a stretchable substrate 120, the pixel units P formed on the stretchable substrate 120, and a plurality of electrodes E that electrically connect the pixel units P to each other.

The stretchable substrate 120 may include a plurality of islands 122 that are disposed in a planar lattice pattern, and a plurality of bridges 124 that connect two adjacent islands 122.

The islands 122 and the bridges 124 are integrally formed by an injection molding and the like.

The islands 122 may be spaced apart evenly from each other, and include a planar upper surface. The pixel units P may be placed on the planar upper surface of the islands 122.

The bridges 124 may be aligned along the first direction (X) and the second direction (Y). One of the islands 122 may have four bridges 124 surrounding it that are disposed along the first direction (X), the second direction (Y), a first negative direction (−X), and a second negative direction (−Y) with respect to the one island 122.

The bridges 124 may be formed as a flexible structure, and the length thereof may be elastically extended or contracted in length by changing the shape depending on the applied force. The length of each bridge 124 aligned along the first direction (X) as well as along the second direction (Y) may be independently changed. Therefore, the stretchable substrate 120 may be stretched in both the first direction (X) and the second direction (Y).

Figure 3:
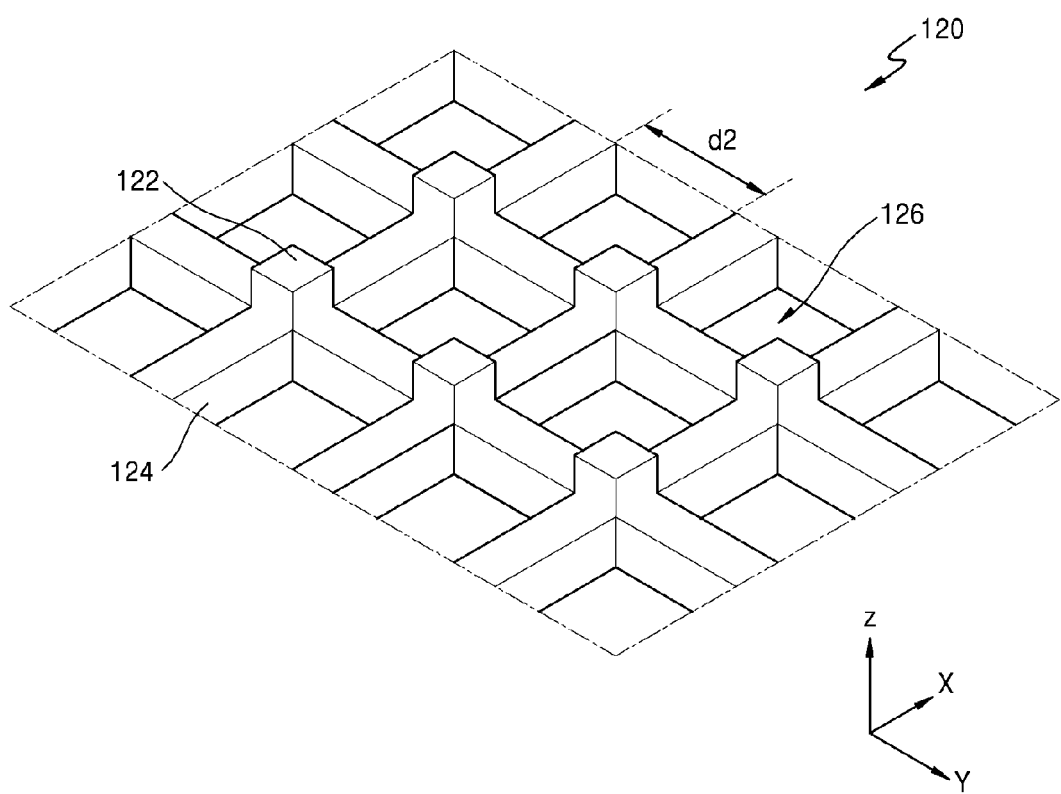
FIG. 3 is a schematic perspective view illustrating an example of the stretchable substrate of the organic light-emitting display apparatus in FIG. 1(B) after stretching.
Figure 4:
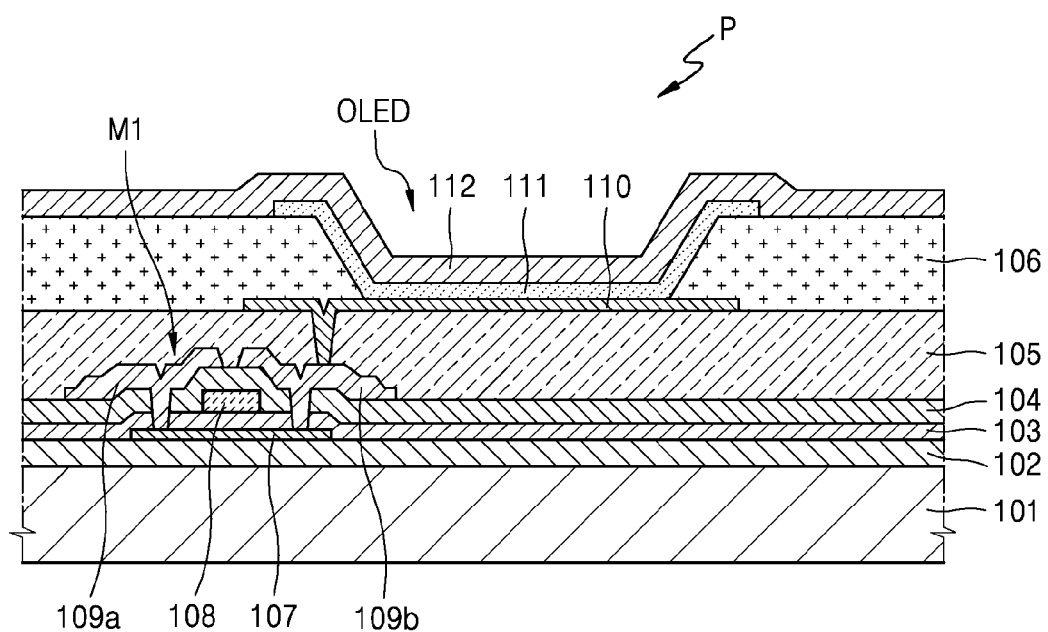
FIG. 4 is a schematic cross-sectional view of some portions of a pixel unit of the organic light-emitting display apparatus in FIG. 1(A).

As shown in FIG. 3, an aperture 126 may be formed between a pair of bridges 124, which are adjacent and parallel to each other among the plurality of the bridges 124. Here, the pair of the bridges 124 parallel to each other may include the pair of bridges 124 parallel to each other in the first direction (X) as well as in the second direction (Y). Thus, the stretchable substrate 120 may have a net pattern, and be extended or contracted in both the first direction (X) and the second direction (Y) as the lengths of the bridges 124 are extended or contracted.

Figure 2:
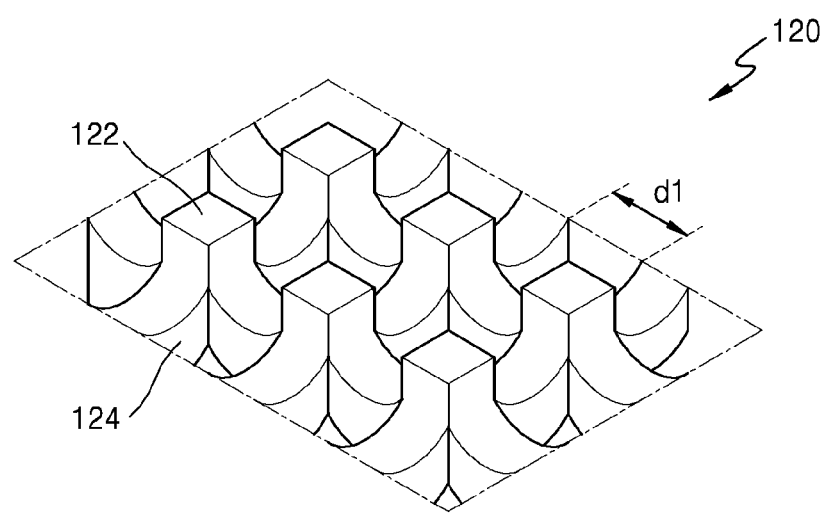
FIG. 2 is a schematic perspective view illustrating an example of the stretchable substrate of the organic light-emitting display apparatus in FIG. 1(A) prior to stretching.

In detail, the bridges 124 may be formed in a convex shape toward the upper portion or the lower portion of the stretchable substrate 120. FIG. 2 shows some portions of the stretchable substrate 120 in FIG. 1(A), which is the state prior to stretching of the organic light-emitting display apparatus 100.

Referring to FIG. 2, each of the bridges 124 may have a constant thickness and be formed in a convex shape toward the lower portion of the stretchable substrate 120. Also, the adjacent islands 122 may be spaced apart by the first distance d1, and likewise, the pixel units P formed on the islands 122 may also be spaced apart by the first distance d1.

If the bridges 124 are formed in a convex shape toward the lower portion of the stretchable substrate 120, bridges 124 are assumed to be in a pre-strain state. Therefore, the bridges 124 may have a planar shape even when exerted on by a small amount of force, and thus, the lengths of the bridges 124 may be increased. Also, because the stretchable substrate 120 is easily bent with respect to the first direction (X) and/or the second direction (Y), the organic light-emitting display apparatus 100 may have a great flexibility.

In FIG. 2, the bridges 124 are illustrated in a form that is convex toward the lower portion of the stretchable substrate 120, but the present invention is not limited thereto. In other words, the bridges 124 may be formed in a convex form toward the upper portion of the stretchable substrate 120, or in the shape of a polygon protruded toward the upper or the lower portion of the stretchable substrate 120.

FIG. 3 shows some portions of the stretchable substrate 120 in FIG. 1(B), which is the state after the organic light-emitting display apparatus 100 stretches. Referring to FIG. 3, as the curved bridges are stretched in a linear manner, the distance between the adjacent islands 124 may be increased to the second distance d2. Accordingly, the distance between the pixel units P is increased to the second distance d2, and the organic light-emitting display apparatus 100 may be stretched in the first direction (X) and/or in the second direction (Y).

Although the shape of each of the bridges 124 has changed from the curved shape to the linear shape, the thickness of each of the bridges 124 may be remained unchanged. In other words, the extension of the stretchable substrate 120 is not the result of the characteristics of the material used to form the substrate 120, but rather by the structural characteristics of the bridges 124. Thus, the stretchable substrate 120 may be formed of various materials not limited to those having a capability for large elongation.

The thickness of each of the islands 122 may be greater than the thickness of each of the bridges 124. Because the greater thickness of each of the islands 122 offers good adhesion between the pixel units P and the islands 122, and keeps the shape of islands 122 unchanged when the stretchable substrate 120 is stretched, the detachment of the pixel units P may be prevented during the stretching of the stretchable substrate 120.

By forming the stretchable substrate 120 of a material with a large elongation characteristic, such as PDMS, the stretchable substrate 120 may be stretched further than the state shown in FIG. 3. Even in this case, the thickness of each of the islands 122 is not changed but the thickness of each of the bridges 124 decreases during the stretching action of the stretchable substrate 120, thereby further increasing the distance between the islands 122. Thus, the position of the pixel units P may be stably secured on the islands 122.

In FIGS. 2 and 3, an example of the extended stretchable substrate 120 is described, but the present invention is not limited thereto. The bridges 124 may change the shape to contract the length thereof by the applied pressure, and thus, the stretchable substrate 120 may be contracted in the first direction (X) and/or in the second direction (Y).

The pixel units P are formed on the islands 122, and each of the pixel units P may have sub pixels of R, G, and B. The sub pixels of R, G, and B, as shown FIG. 4, may include a driving TFT (M1) formed on a substrate 101 and an organic light-emitting device (OLED).

The substrate 101 may be formed of a plastic material such as acrylic, polyimide, polycarbonate, polyester, and mylar. A barrier layer and/or an insulating layer 102 like a buffer layer may be formed on the upper surface of the substrate 101 so as to prevent dopant ion from spreading out, thereby protecting the substrate 101 from the penetration of the moisture and the foreign material, and to make the surface planar.

An active layer 107 of the driving TFT (M1) may be formed of a semiconductor material on the insulating layer, and a gate insulating layer 103 may be disposed to cover the active layer 107. The active layer 107 may be formed of an inorganic semiconductor, such as amorphous silicon or polysilicon, or an organic semiconductor.

A gate electrode 108 is formed on a gate insulating layer 103, and an interlayer insulating layer 104 is formed to cover the gate electrode 108. Then, a source electrode 109a and a drain electrode 109b are formed on the interlayer insulating layer 104, and a passivation layer 105 and a pixel defining layer 106 are sequentially formed to cover the source electrode 109a and the drain electrode 109b.

The gate electrode 108, the source electrode 109a, and the drain electrode 109b may be formed of, but not limited to, a metal such as Al, Mo, Au, Ag, Pt/Pd, or Cu; may be covered with a resin paste including a powder type of the metal; and may employ a conductive polymer.

The gate insulating layer 103, the interlayer insulating layer 104, the passivation layer 105, and the pixel defining layer 106 may be formed as insulators while being formed of an organic material, an inorganic material, or an organic and inorganic compound with a single-layer or multi-layer.

The organic light-emitting device (OLED) displays predetermined image information by emitting the light of red, green, and blue according to the current flow, and may include a pixel electrode 110 that is connected to one of the source electrode 109a and the drain electrode 109b of the driving TFT (M1), an opposite electrode 112 that covers the entire pixel, and an organic light-emitting layer 111 that is disposed between the pixel electrode 110 and the opposite electrode 112 to emit the light.

Pixel units P may be formed directly on islands 122, or may be formed by radiating the pixel units P formed on a carrier substrate (not shown) onto the islands 122 after forming the pixel units P on the carrier substrate.

The electrodes E may electrically connect the pixel units P to each other. Because the distance between the pixel units P is increased during the stretching of the stretchable substrate 120, the length of the electrodes E that electrically connects the pixel units P to each other may be determined taking into account the increase in the distance between the pixel units P.

For example, the length of the electrodes E may be greater than the maximum length of the bridges 124. Here, the maximum length of the bridges 124 refers to the length in which the bridges 124 are fully stretched. If the lengths of the electrodes E are longer than the maximum length of the bridges 124, as in the aforementioned case, the electrodes E may be prevented from being disconnected even when the organic light-emitting display apparatus 100 is stretched in the first direction (X) and in the second direction (Y). Also, the electrodes E may have a spring shape or have several bends to provide elasticity before the organic light-emitting display apparatus 100 is stretched.

Meanwhile, in FIGS. 1 to 4, the pixel units P are formed on one stretchable substrate 120, but the present invention is not limited to this example. The organic light-emitting display apparatus 100 according to another exemplary embodiment of the present invention may have two stretchable substrates 120, such that wherein the two stretchable substrates 120 are disposed symmetrically with respect to a X-Y plane, and the pixel units P may be placed between the islands 122 of the two stretchable substrates 120 disposed symmetrically to each other. That is, the islands 122 may be disposed on the upper portion and the lower portion of the pixel units P. As described in this case, if the two stretchable substrates 120 are disposed symmetrically with respect to the X-Y plane, the pixel units P may be better and more effectively protected from external shock and the like in more effective manner.

A sealing film formed of an elastic material may be used to seal the organic light-emitting display apparatus 100, and thus, prevent the external moisture or oxygen from penetrating into the inside.

Figure 5:
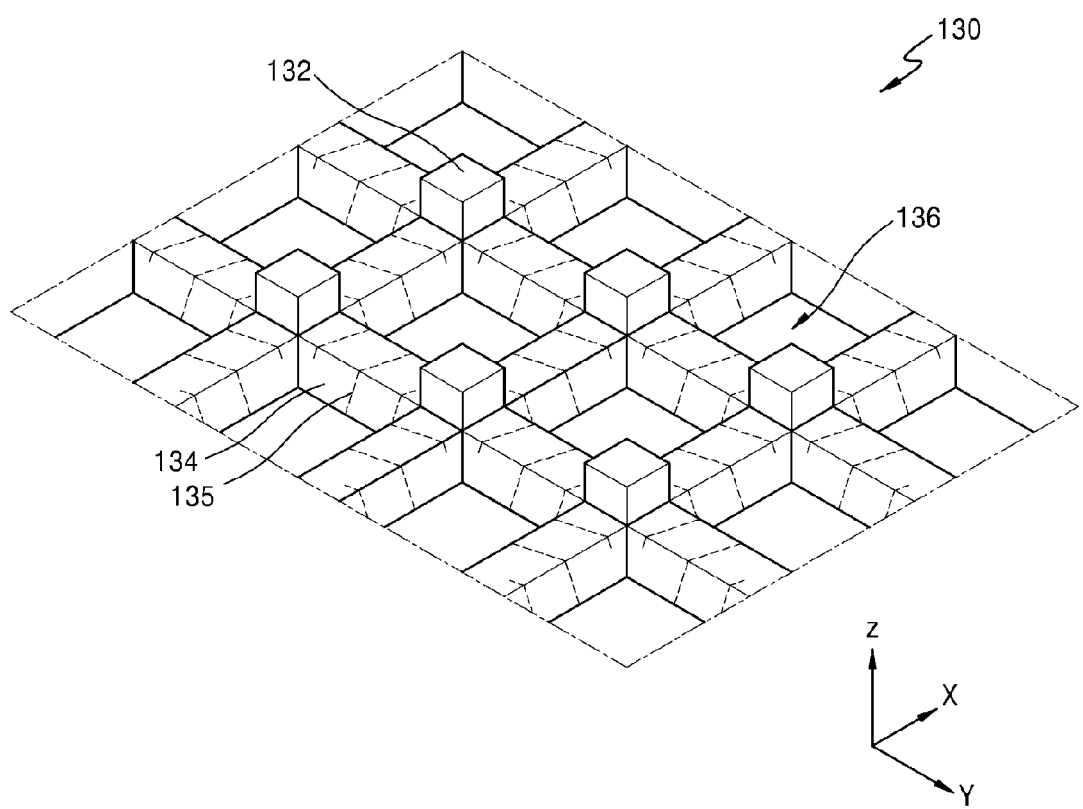
FIG. 5 is a schematic perspective view illustrating another example of the stretchable substrate of the organic light-emitting display apparatus in FIG. 1(A) prior to stretching.
Figure 6:
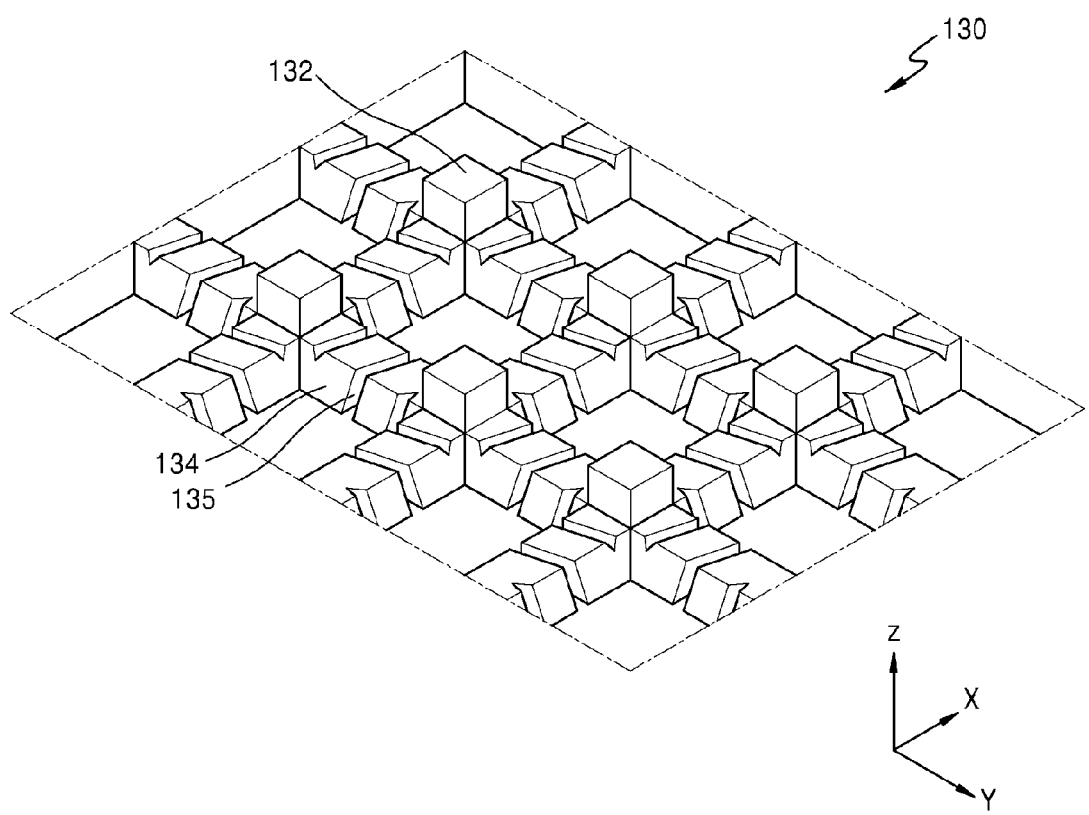
FIG. 6 is a schematic perspective view illustrating another example of the stretchable substrate of the organic light-emitting display apparatus in FIG. 1(B) after stretching.

FIG. 5 is a schematic perspective view illustrating another example of the stretchable substrate of the organic light-emitting display apparatus in FIG. 1(A) prior to stretching, and FIG. 6 is a schematic perspective view illustrating another example of the stretchable substrate of the organic light-emitting display apparatus in FIG. 1(B) after stretching.

Referring to FIGS. 5 and 6, a stretchable substrate 130 may include a plurality of islands 132 disposed in a planar lattice pattern, and a plurality of bridges 134 that connect the two adjacent islands 132 among the islands 132. The islands 132 and bridges 134 are integrally formed by an injection molding and the like.

The islands 132 may be disposed to be spaced apart by a constant distance from each other, and include a planar upper surface. Also, the of bridges 134 may be formed as a flexible structure, and the length thereof may be elastically extended or contracted in length by changing the shape depending on the applied force.

For example, as illustrated in FIG. 5, each of the bridges 134 may include grooves 135. The grooves 135 may be formed in a helical shape on the outer surface of the bridges 134. During the stretching of the bridges 134, as illustrated in FIG. 6, the length of the bridges 134 may be increased as a result of the increase in the width of the grooves 135. As a result, the stretchable substrate 130 may be stretched. In other words, because the stretchable substrate 130 may be stretched by a structure characteristic of the bridges 134, the stretchable substrate 130 may be formed of various materials while not being limited to those with a large elongation.

The depth of each of the grooves 135 may be in a range of about ⅓ to about ⅔ of the thickness of each of the bridges 134. If the depth of each of the grooves 135 is less than ⅓ of the thickness of each of the bridges 134, the width of each of the grooves 135 is minimally increased, thereby resulting in lower impact on the stretching of the stretchable substrate 130. If the depth of each of the grooves 135 is greater than ⅔ of the thickness of each of the bridges 134, a crack may appear at the grooves 135 during the stretching of the stretchable substrate, thereby causing a crack or disconnection of the bridges 134. In this regard, the depth of each of the grooves 135 may be formed in a range of about ⅓ to about ⅔ of the thickness of each of the bridges 134.

Because bridges 134 are aligned in the first direction (X) and in the second direction (Y), and an aperture 136 is formed between each pair of bridges 134, which are adjacent and parallel to each other, the stretchable substrate 130 may have a net pattern. The lengths of the bridges 134 aligned along both the first direction (X) and the second direction (Y) may be independently changed. Therefore, the stretchable substrate 130 may be stretched in the first direction (X), or in the second direction (Y), or in both the first direction (X) and the second direction (Y).

The thickness of each of the islands 132 may be formed to be greater than the thickness of each of the bridges 134. As described above, the bridges 134 have the grooves 135, and thus, the lengths of the bridges 134 are structurally increased prior to the change in shape of the islands 132 during the stretching of the stretchable substrate 130, even when the thicknesses of the islands 132 are the same as that of the bridges 134. Accordingly, although the thicknesses of the islands 132 are the same as those of the bridges 134, the shapes of the islands 132 remain unchanged during the stretching of the stretchable substrate 130, thereby stably securing the positions of the pixel units P formed on the islands 132.

If the thickness of each of the islands 132 is formed to be greater than the thickness of each of the bridges 134, the adhesion between the pixel units P and the islands 132 may be improved, and the detachment of the pixel units during the stretching of the stretchable substrate 130 may be effectively prevented as a result of the unchained shape of the islands 132 during the stretching of the stretchable substrate 130.

In FIGS. 5 and 6, the example in which the stretchable substrate 130 is stretched is described, but the present invention is not limited thereto. In other words, when the grooves 135 are formed to maintain a constant width in a stable state, which is the state in which the external force is not applied to the stretchable substrate 130, the widths of the grooves 135 may be increased, and may also be decreased. Therefore, if external pressure is applied to reduce the widths of the grooves 135, the lengths of the bridges 134 are decreased, thereby reducing the area of the stretchable substrate 130.

As described above, according to the above exemplary embodiments of the present invention, the stretchable substrate may have a large elongation characteristic das a result of the structural characteristic thereof, and secure the position of pixel unit in a stable manner during the stretching and contraction of an organic light-emitting display apparatus.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A stretchable substrate comprising:
   a plurality of islands that are disposed in a planar lattice pattern and spaced apart from each other; and
   a plurality of bridges connecting two adjacent islands;
   wherein:
   an aperture is formed between a pair of bridges, which are adjacent and parallel to each other;
   the bridges are configured to stretch and contract such that the shapes of the islands remain unchanged during the stretching and contraction of the bridges; and
   the islands and bridges are integrally formed of the same material.

2. The stretchable substrate of claim 1, wherein the thickness of each of the islands is greater than the thickness of each of the bridges.

3. The stretchable substrate of claim 1, wherein each of the bridges has a convex shape toward the upper portion or the lower portion of the stretchable substrate.

4. The stretchable substrate of claim 3, wherein the bridges are configured to become planar during the stretching of the bridges.

5. The stretchable substrate of claim 1, wherein helical grooves are formed on the outer surface of each of the bridges.

6. The stretchable substrate of claim 5, wherein the width of each of the grooves is changed during the stretching and contraction of the bridges.

7. An organic light-emitting display apparatus comprising:
   a stretchable substrate comprising a plurality of islands disposed in a planar lattice pattern, and a plurality of bridges connecting two adjacent islands; and
   a plurality of pixel areas formed on the stretchable substrate,
   wherein:
   the pixel areas are formed on the islands;
   the bridges are configured to stretch and contract;
   the distances between the pixel areas changes during the stretching and contraction of the bridges; and
   the islands and bridges are integrally formed of the same material.

8. The apparatus of claim 7, wherein an aperture is formed between a pair of bridges adjacent and parallel to each other.

9. The apparatus of claim 7, wherein the shapes of the islands remain unchanged during the stretching and contraction of the bridges.

10. The apparatus of claim 7, wherein the thickness of the islands is greater than the thickness of each of the bridges.

11. The apparatus of claim 7, wherein each of the bridges is formed in a convex shape toward the upper portion or the lower portion of the stretchable substrate.

12. The apparatus of claim 11, wherein the shapes of the bridges become planar during the stretching of the bridges.

13. The apparatus of claim 7, wherein each of the bridges comprises grooves on the outer surface thereof.

14. The apparatus of claim 13, wherein the widths of the grooves are changed during the stretching and contraction of the bridges.

15. The apparatus of claim 7, wherein:
- the organic light-emitting display apparatus comprises a plurality of electrodes connecting the pixel areas to each other; and
- the length of each of the electrodes is greater than the maximum length of each of the bridges.

* * * * *